United States Patent
Zang et al.

(10) Patent No.: US 9,960,077 B1
(45) Date of Patent: May 1, 2018

(54) ULTRA-SCALE GATE CUT PILLAR WITH OVERLAY IMMUNITY AND METHOD FOR PRODUCING THE SAME

(71) Applicant: GLOBALFOUNDRIES Inc., Grand Cayman (KY)

(72) Inventors: Hui Zang, Guilderland, NY (US); Josef Watts, Saratoga Springs, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/679,848

(22) Filed: Aug. 17, 2017

(51) Int. Cl.
| | |
|---|---|
| *H01L 21/8234* | (2006.01) |
| *H01L 21/762* | (2006.01) |
| *H01L 21/02* | (2006.01) |
| *H01L 27/088* | (2006.01) |
| *G03F 7/20* | (2006.01) |
| *H01L 21/28* | (2006.01) |
| *H01L 29/78* | (2006.01) |

(52) U.S. Cl.
CPC .... *H01L 21/76264* (2013.01); *G03F 7/70633* (2013.01); *H01L 21/02381* (2013.01); *H01L 21/02496* (2013.01); *H01L 21/28141* (2013.01); *H01L 21/823431* (2013.01); *H01L 27/0886* (2013.01); *H01L 29/785* (2013.01)

(58) Field of Classification Search
CPC .................................................. H01L 21/8232
See application file for complete search history.

(56) References Cited

U.S. PATENT DOCUMENTS 9,431,305 B1 * 8/2016 Anderson ......... H01L 21/82388

* cited by examiner

*Primary Examiner* — Cheung Lee
(74) *Attorney, Agent, or Firm* — Ditthavong & Steiner, P.C.

(57) ABSTRACT

Methods of forming a self-aligned CT pillar with the same CD width as the device fins to enable PC isolation and the resulting devices are provided. Embodiments include forming a plurality of fins over a substrate; forming an oxide layer over the substrate and between each fin; removing a portion of a central fin among the plurality, a trench formed in the oxide layer; forming a CT pillar in the trench; recessing the oxide layer below an upper surface of the plurality of fins; forming a gate over the plurality of fins and CT pillar; planarizing the gate down to the CT pillar; and forming a cap layer over the gate and CT pillar.

20 Claims, 31 Drawing Sheets

ULTRA-SCALE GATE CUT PILLAR WITH OVERLAY IMMUNITY AND METHOD FOR PRODUCING THE SAME

TECHNICAL FIELD

The present disclosure relates to the manufacture of a fin field-effect transistor (FinFET) semiconductor device. The present disclosure is particularly applicable to the 7 nanometer (nm) technology node and beyond.

BACKGROUND

With aggressive scaling of the FinFET technology design rule, use of a gate cut (CT) pillar for gate (PC) isolation becomes increasingly challenging. In particular, the CT pillar must land between trenches and allow enough room for work function (WF) metal to be subsequently formed on the sides of the device fins. A known approach for using a CT pillar for PC isolation involves forming carbon spacers in amorphous carbon (a-C) and silicon oxynitride (SiON) layers of a CT lithography stack. Another known approach involves forming trenches in an amorphous silicon (a-Si) layer and then filling the trenches with silicon nitride (SiN). However, with respect to both approaches, the WF metal of the CT pillar often merges with the WF metal at the edge of an adjacent fin, resulting in threshold voltage ($V_t$) variation and/or the CT pillar to active fin (RXFIN) critical dimension (CD) is insufficient for proper formation.

A need therefore exists for methodology enabling formation of a small CT pillar without overlay or fin merger issues and the resulting device.

SUMMARY

An aspect of the present disclosure is a method of forming a self-aligned CT pillar with the same CD width as the device fins for PC isolation.

Another aspect of the present disclosure is a device having a self-aligned CT pillar with the same CD width as the device fins.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of fins over a substrate; forming an oxide layer over the substrate and between each fin; removing a portion of a central fin among the plurality, a trench formed in the oxide layer; forming a CT pillar in the trench; recessing the oxide layer below an upper surface of the plurality of fins; forming a gate over the plurality of fins and CT pillar; planarizing the gate down to the CT pillar; and forming a cap layer over the gate and CT pillar.

Aspects of the present disclosure include forming the plurality of fins by: forming a SiN layer over the substrate; patterning the SiN layer, a plurality of SiN caps formed; and removing portions of the substrate through the plurality of SiN caps, a SiN cap remaining over each fin of the plurality. Other aspects include forming the oxide layer by: forming the oxide layer over the substrate and between the plurality of fins and each SiN cap; and planarizing the oxide layer down to the SiN caps. Further aspects include forming a dummy cap over each fin of the plurality by: removing each SiN cap, a trench formed in the oxide layer over each fin; forming a dummy layer over the substrate and in each trench; and planarizing the dummy layer down to the oxide layer. Additional aspects include removing the portion of the central fin by: forming a photoresist layer over the substrate; forming an opening in the photoresist layer over the central fin down to the oxide layer; removing a dummy cap and the portion of the central fin through the opening; and stripping the photoresist layer. Further aspects include forming the CT pillar by: forming a SiN layer over the substrate and in the trench; and planarzing the SiN layer down to the oxide layer. Other aspects include forming the gate by: forming a dummy oxide layer over and along sidewalls of the plurality of fins; forming a high-k (HK) layer over the substrate and along sidewalls of the CT pillar; forming a WF metal layer over the HK layer; and forming the gate over the WF metal layer. Additional aspects include forming a dummy gate over the substrate subsequent to the forming of the dummy oxide layer and prior to the forming of the HK layer; forming a cap layer over the dummy gate; and removing the dummy gate and cap layer prior to forming the HK layer.

Another aspect of the present disclosure is a device including: a plurality of fins over a substrate; an oxide layer over the substrate and between a portion of each fin; a CT pillar over a central fin among the plurality, a lower surface of the CT pillar being below an upper surface of the oxide layer; a gate over the plurality of fins and CT pillar; and a cap layer over the gate and CT pillar. Aspects of the device include a dummy oxide layer over and along sidewalls of the plurality of fins; a HK layer over the substrate and along sidewalls of the CT pillar; a WF metal layer over and along the HK layer; and the gate over the WF metal layer.

A further aspect of the present disclosure is a method including: forming a first oxide layer over a substrate; forming a first SiN layer over the oxide layer; forming a trench through the first SiN and oxide layers and a portion of the Si substrate; forming a second oxide layer in and along sidewalls of the trench; recessing the second oxide layer between an upper surface of the substrate and an upper surface of the first oxide layer; filling the trench with a second SiN layer; forming a plurality of first and second SiN layer mandrels laterally separated over the substrate; removing equal portions of the second SiN layer in the trench on opposite sides of a second SiN layer mandrel; forming a plurality of fins and a CT pillar laterally centered therebetween over the substrate; forming an third oxide layer over the substrate and between a portion of the plurality of fins and CT pillar; forming a gate over the plurality of fins and CT pillar; planarizing the gate down to the CT pillar; and forming a cap layer over the gate and CT pillar.

Aspects of the present disclosure include forming the trench by: forming a photoresist layer over the substrate; forming an opening laterally centered over the substrate through the photoresist layer down to the first SiN layer; etching the first SiN and oxide layers and the substrate through the opening to a depth of 50 nm to 200 nm below an upper surface of the substrate; and stripping the photoresist layer. Further aspects include forming the plurality of first and second SiN layer mandrels by: forming a medium temperature oxide (MTO) layer over the first and second SiN layers; forming a silicon (Si) layer over the MTO layer; forming an a-C layer over the Si layer; and performing a self-aligned quadruple patterning (SAQP) process through the a-C, Si, MTO, and first and second SiN layers down to the oxide layer. Additional aspects include removing the equal portions by: reactive-ion etching (RIE). Another aspect includes forming the plurality of fins and the CT pillar by: etching the first and second oxide layers, substrate, and a portion of the second SiN layer in the trench to a depth of 50 nm to 150 nm, a first oxide layer cap formed over each fin; and removing the first and second SiN mandrels. Other aspects include removing the first oxide layer caps prior to the forming of the third oxide layer. Additional aspects include forming a dummy oxide layer over and along sidewalls of the plurality of fins; forming a HK layer over the substrate and along sidewalls of the CT pillar; forming a WF metal layer over the HK layer; and forming the gate over the WF metal layer. Further aspects include forming a dummy gate over the substrate subsequent to the forming of the dummy oxide layer and prior to the forming of the HK layer; forming a cap layer over the dummy gate; and removing the dummy gate and cap layer prior to forming the HK layer.

Another aspect of the present disclosure is a device including: a plurality of fins over a substrate, the substrate having a laterally centered trench; a first oxide layer in and along sidewalls of the trench; a CT pillar laterally centered over the trench and having a base over and along sidewalls of the first oxide layer; a second oxide layer over the substrate and between the fins and CT pillar, an upper surface of the second oxide layer below an upper surface of the fins; a gate over the plurality of fins and CT pillar; and a cap layer over the gate and CT pillar. Aspects of the device include a dummy oxide layer and along sidewalls of the plurality of fins; a HK layer over the substrate and along sidewalls of the CT pillar; a WF metal layer over and along the HK layer; and the gate over the WF metal layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of WF metal of a CT pillar merging with WF metal of an adjacent device fin thereby causing $V_t$ variation attendant upon providing PC isolation within a FinFET device. The problem is solved, inter alia, by forming a self-aligned CT pillar having the same CD width as the device fins.

Methodology in accordance with embodiments of the present disclosure includes forming a plurality of fins over a substrate. An oxide layer is formed over the substrate and between each fin and a portion of a central fin among the plurality is removed, a trench being formed in the oxide layer. A CT pillar is formed in the trench and the oxide layer is recessed below an upper surface of the plurality of fins. A gate is formed over the plurality of fins and CT pillar. The gate is planarized down to the CT pillar and a cap layer is formed over the gate and CT pillar.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
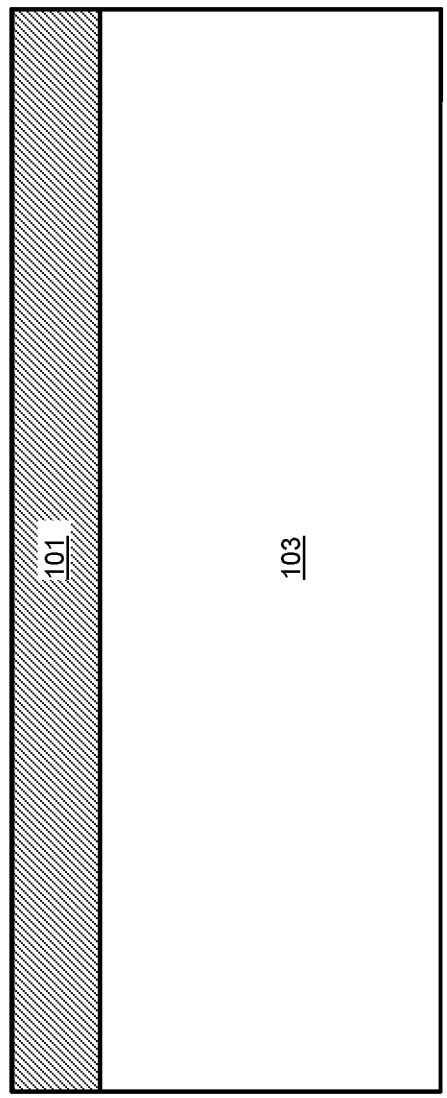
FIGS. 1 through 15 schematically illustrate cross-sectional views of a process flow for forming a self-aligned CT pillar having the same CD width as the device fins to provide PC isolation, in accordance with an exemplary embodiment.
Figure 2:
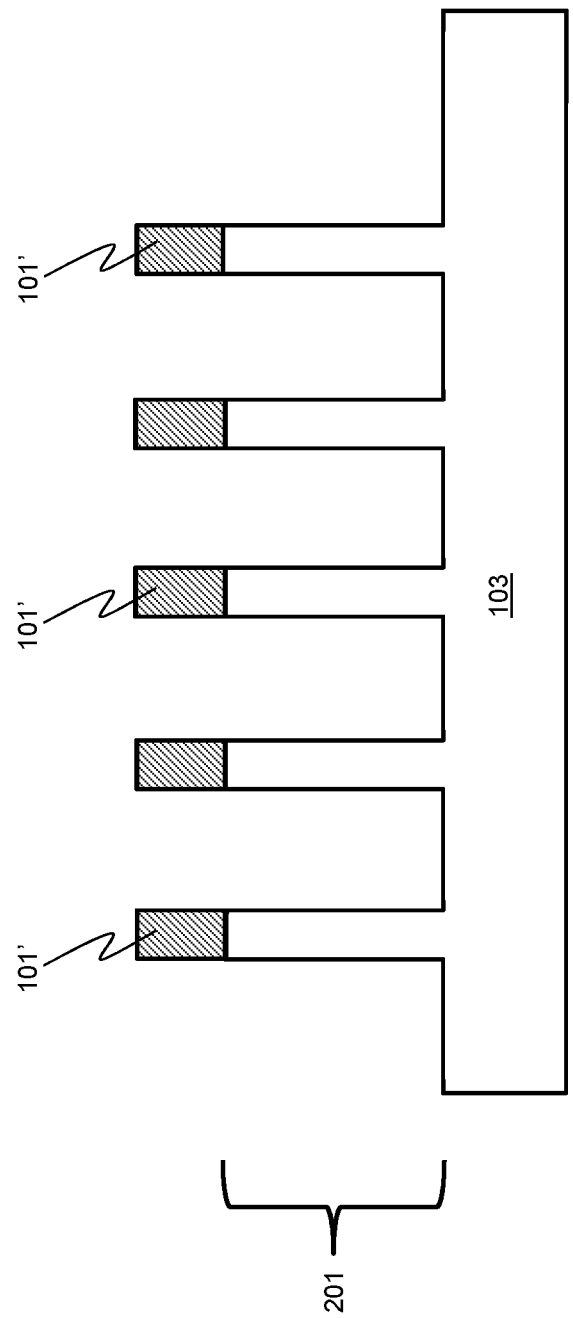
Figure 3:
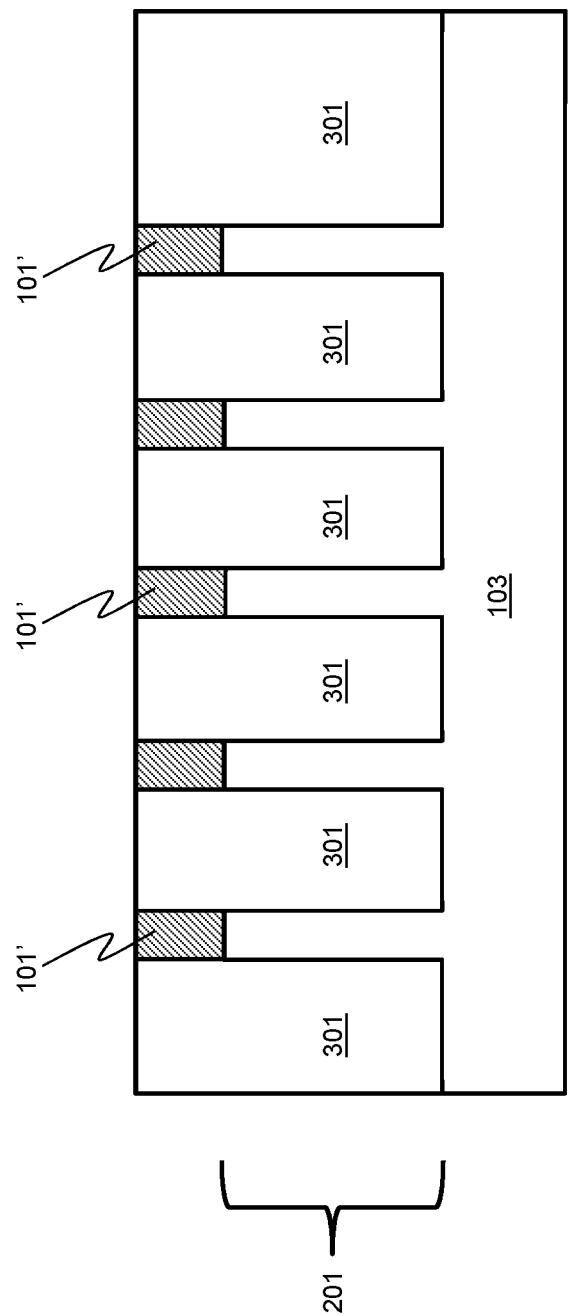

FIGS. 1 through 16 schematically illustrate cross-sectional views of a process flow for forming a self-aligned CT pillar having the same CD width as the device fins to provide PC isolation, in accordance with an exemplary embodiment. Referring to FIG. 1, a SiN layer 101 is formed, e.g., to a thickness of 10 nm to 15 nm, over a substrate 103, e.g., formed of Si. The SiN layer 101 is then patterned (not shown for illustrative convenience), forming a plurality of SiN caps 101'. Portions of the substrate 103 are then removed, e.g., by etching, through the SiN caps 101' forming Si fins 201, a SiN cap 101' remaining over each fin, as depicted in FIG. 2. Referring to FIG. 3, a flowable oxide layer 301 is formed over the substrate 103 and between the fins 201 and each SiN cap 101' and then planarized, e.g., by chemical mechanical polishing (CMP), down to the SiN caps 101'.

Figure 4:
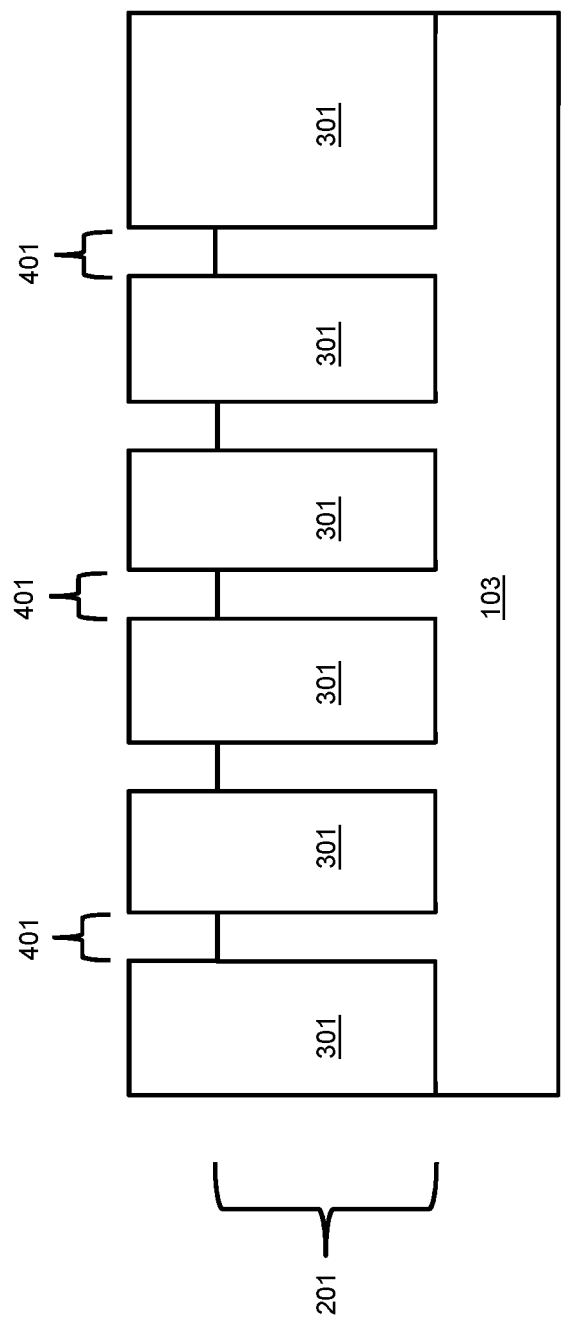
Figure 5:
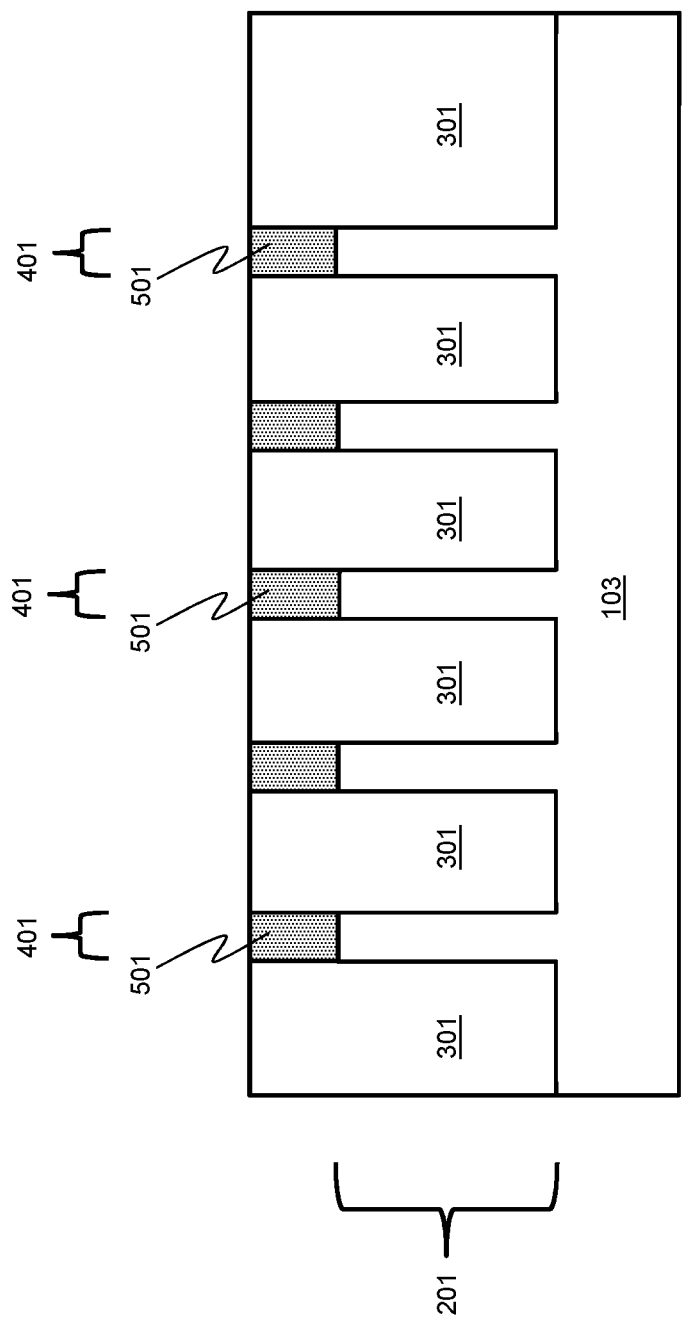

Next, each SiN cap 101' is removed, e.g., by dry etching or a selective wet etching, forming a trench 401 in the oxide layer 301 over each fin 201, as depicted in FIG. 4. Referring to FIG. 5, a dummy layer (not shown for illustrative convenience) is formed, e.g., of a mixture of polysilicon germanium, spin-on-hardmask, and titanium nitride, over the substrate 103 and in each trench 401. The dummy layer is then planarized, e.g., by CMP, down to the oxide layer 301, forming dummy caps 501.

Figure 6:
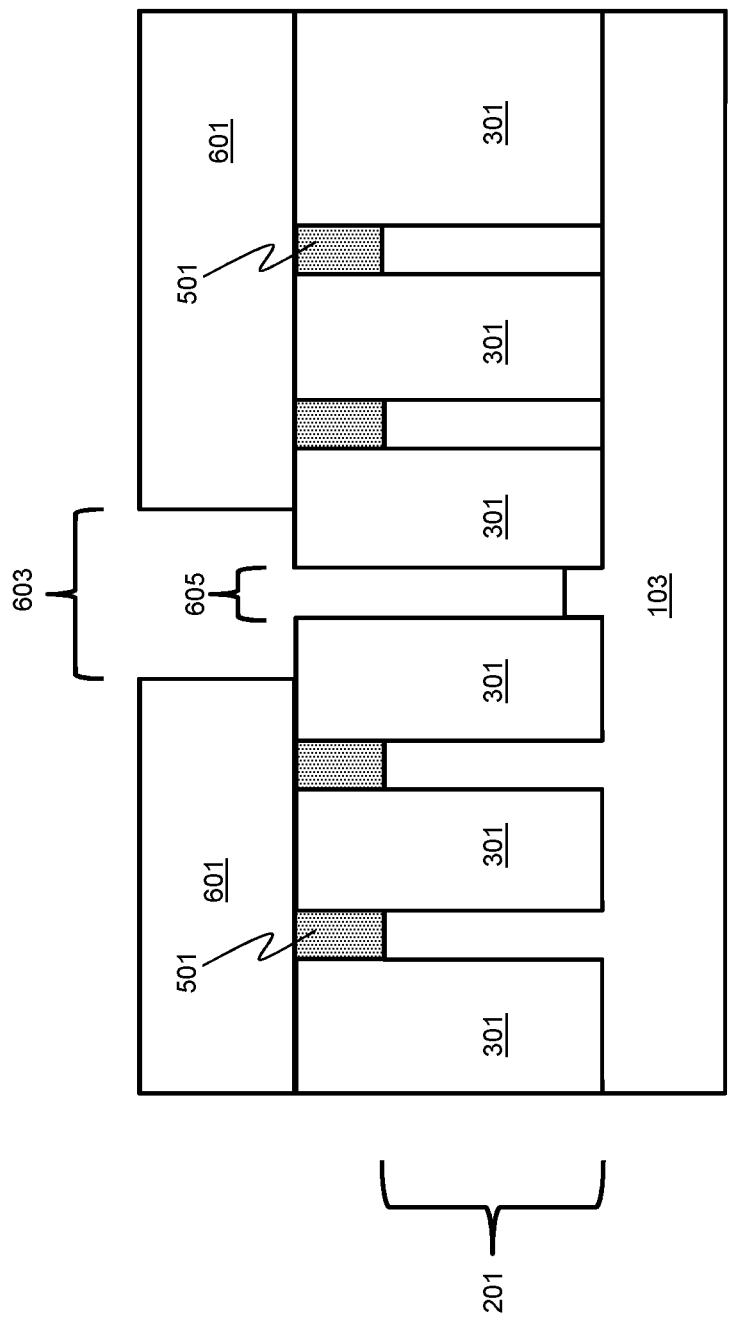
Figure 7:
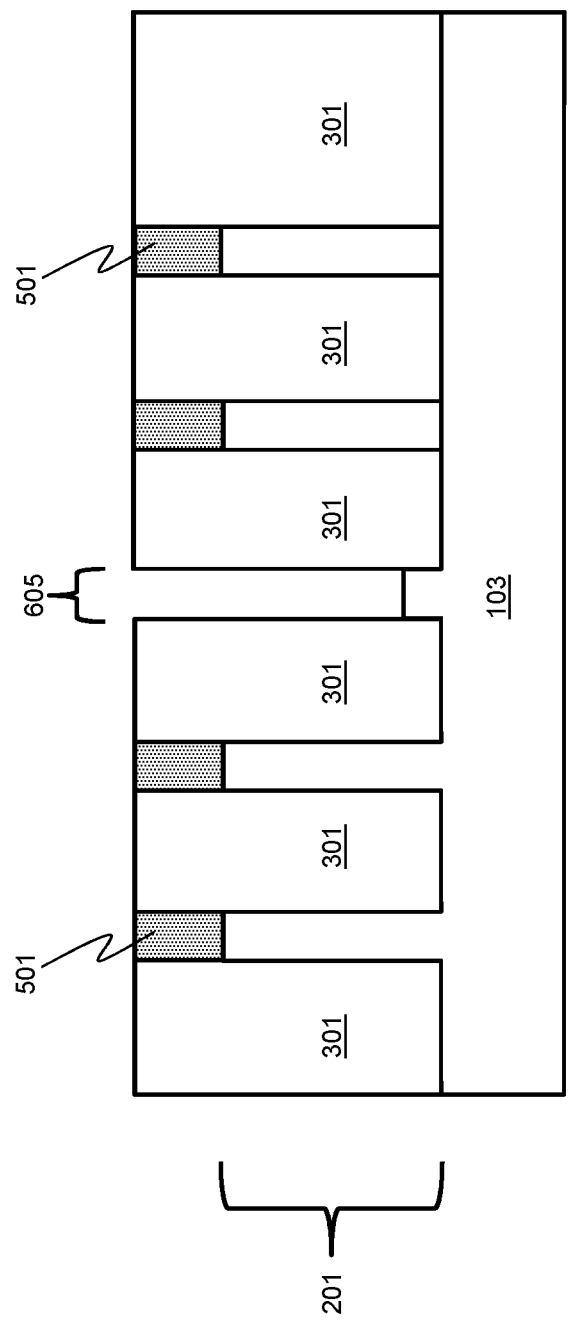
Figure 8:
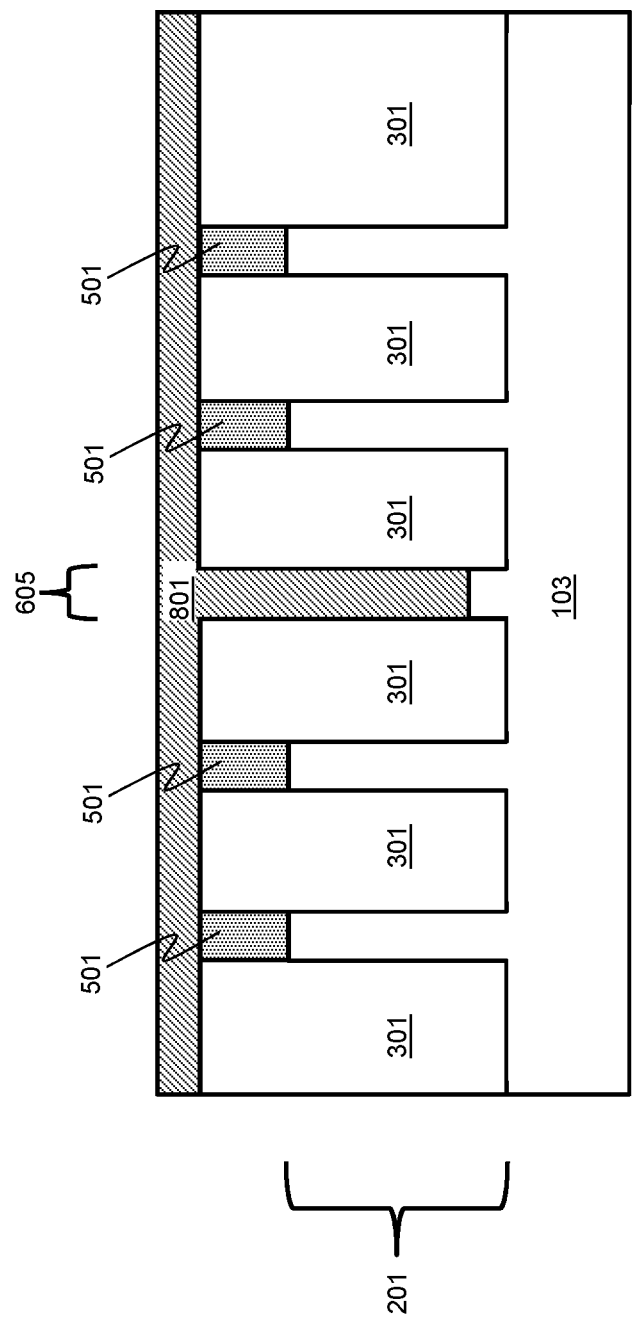
Figure 9:
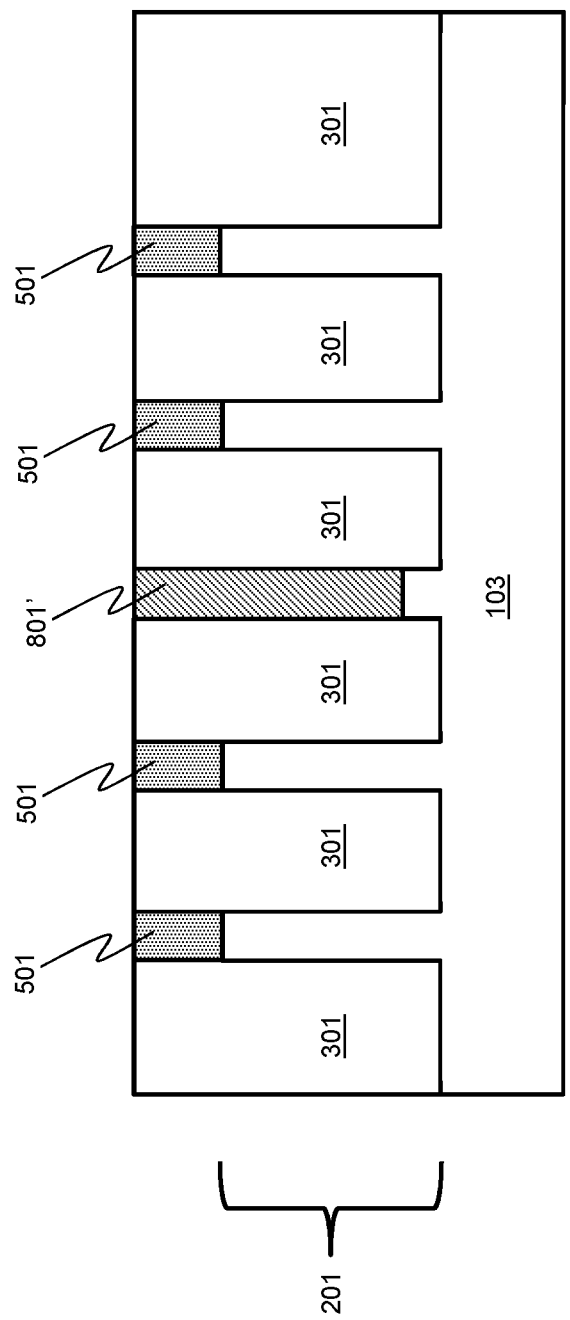

Referring to FIG. 6, a photoresist layer 601 is formed over the substrate 103 and an opening 603 is formed, e.g., by photolithography, through the photoresist layer 601 over the central fin 201 of the plurality down to the oxide layer 301. The exposed dummy cap 501 over the central fin 201 is removed along with a portion of the exposed central fin 201, e.g., 30 nm to 130 nm in depth below the upper surface of the oxide layer 301, forming the trench 605. The photoresist layer 603 is then removed, as depicted in FIG. 7. Next, a SiN layer 801 is formed over the substrate 103 and in the trench 605, as depicted in FIG. 8. Referring to FIG. 9, the SiN layer 801 is planarized, e.g., by CMP, down to the oxide layer 301, forming the CT pillar 801'. By forming the CT pillar 801' in the trench 605, the CT pillar 801' has perfect overlay and has the same CD width as the fins 201.

Figure 10:
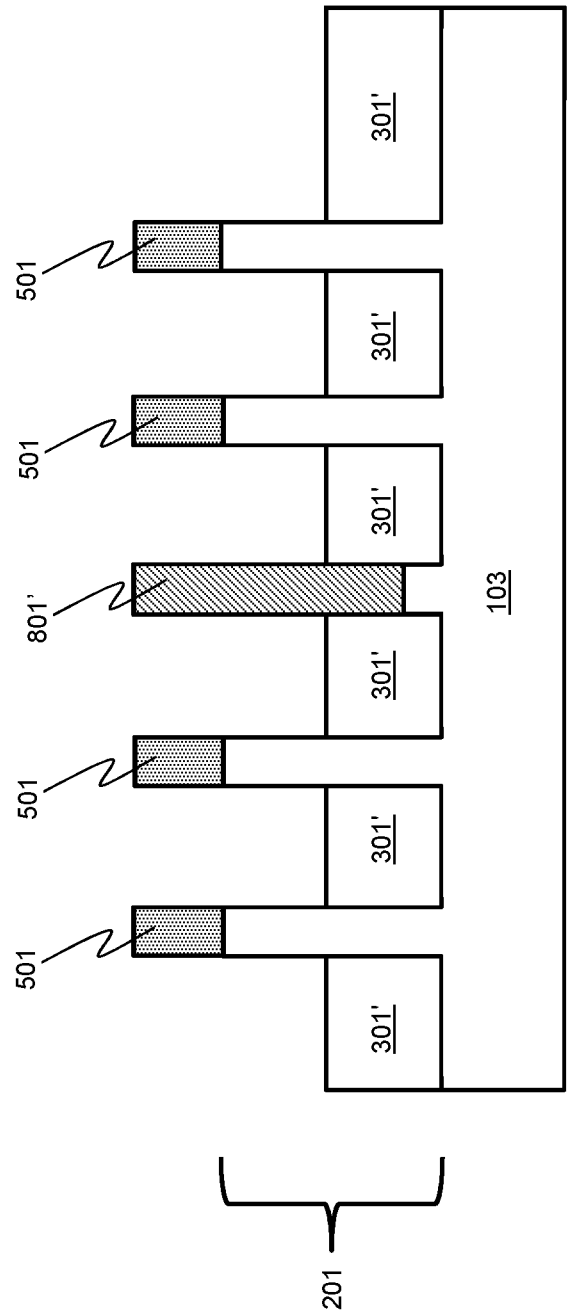
Figure 11:
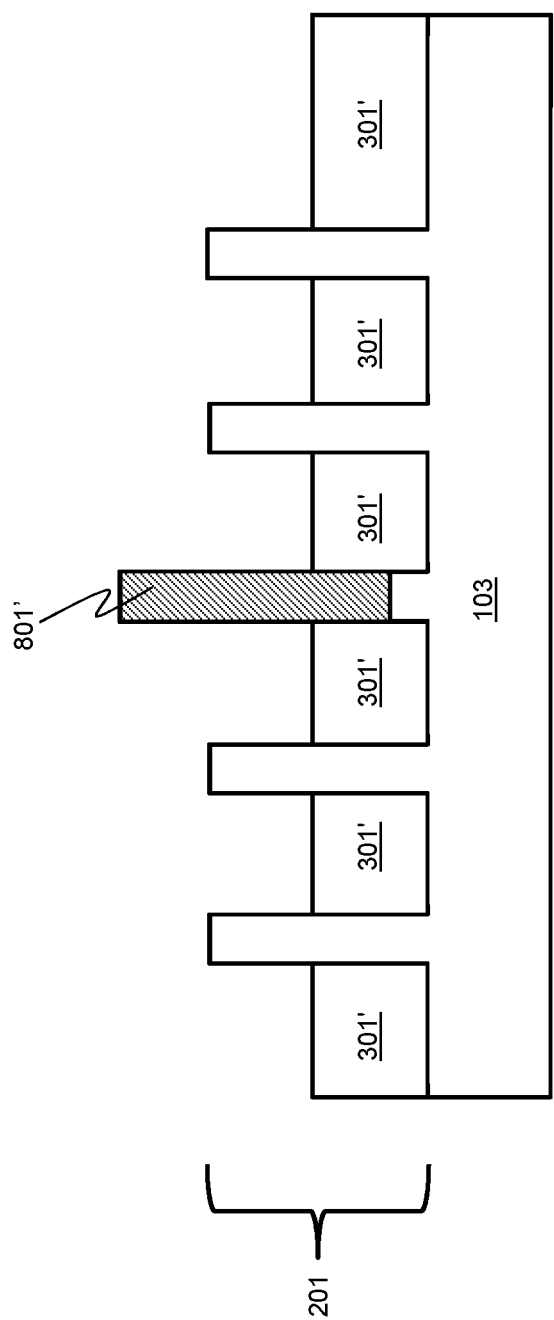

Next, the oxide layer 301 is recessed, e.g., 20 nm to 120 nm, forming the oxide layer 301', as depicted in FIG. 10. The oxide layer 301 may be recessed, e.g., by a SiCoNi™ etch process or with diluted hydrofluoric acid (DHF). Referring to FIG. 11, the dummy caps 501 are removed. A dummy oxide layer (not shown for illustrative convenience) is then formed over and along the sidewalls of the fins 201 to protect them during the subsequent replacement metal gate process.

Figure 12:
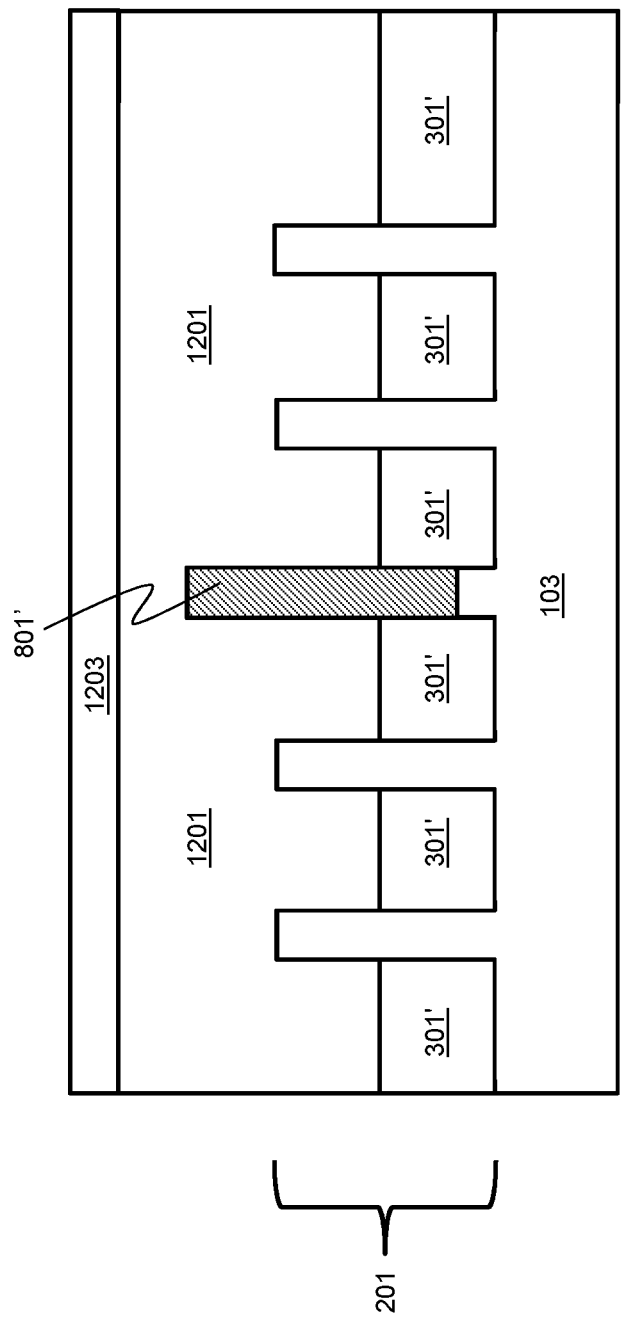
Figure 13:
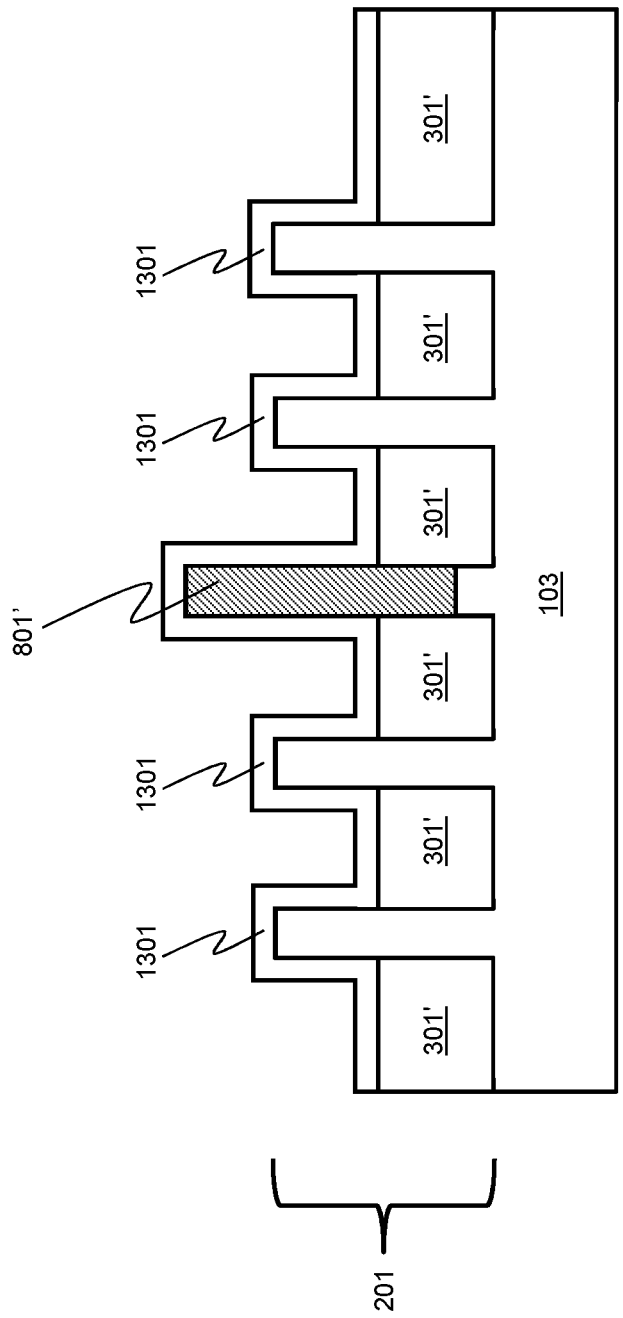
Figure 14:
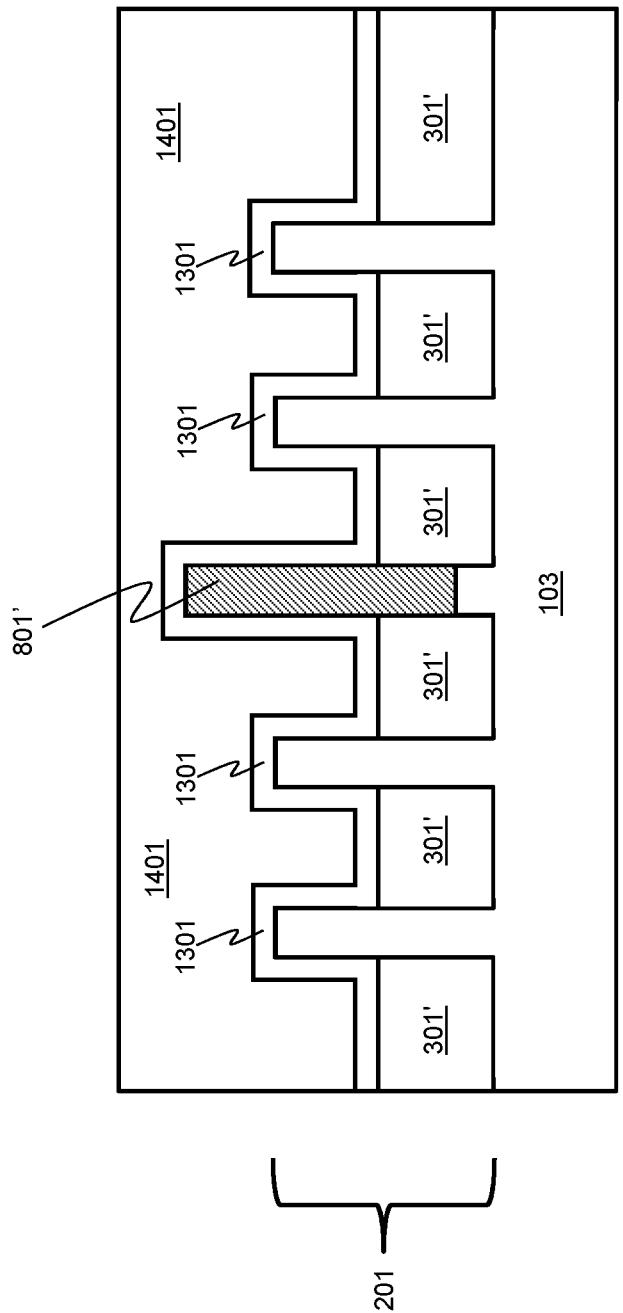

Referring to FIG. 12, a dummy gate 1201 is formed, e.g., of Si, over the substrate 103. In this instance, there is a distance between the top of the CT pillar 801' and an upper surface of the dummy gate 1201; however, it is contemplated that that the CT pillar 801' could penetrate through the top of the dummy gate 1201. Next, a cap layer 1203 is formed, e.g., of SiN, over the dummy gate 1201. The dummy gate 1201 and cap layer 1203 are then removed and a HK layer (not shown for illustrative convenience) is formed, e.g., to a thickness of 1 nm to 5 nm, over the substrate 103 and along the sidewalls of the CT pillar 801'. Next, a WF metal layer 1301 is formed, e.g., to a thickness of 3 nm to 15 nm, over the HK layer, as depicted in FIG. 13. Thereafter, a gate 1401 is formed, e.g., of tungsten (W), over the WF metal layer 1301, and then planarized, e.g., by CMP, as depicted in FIG. 14. At this stage of the process, the gate 1401 may be planarized down to, but not past, the WF layer 1301.

Figure 15:
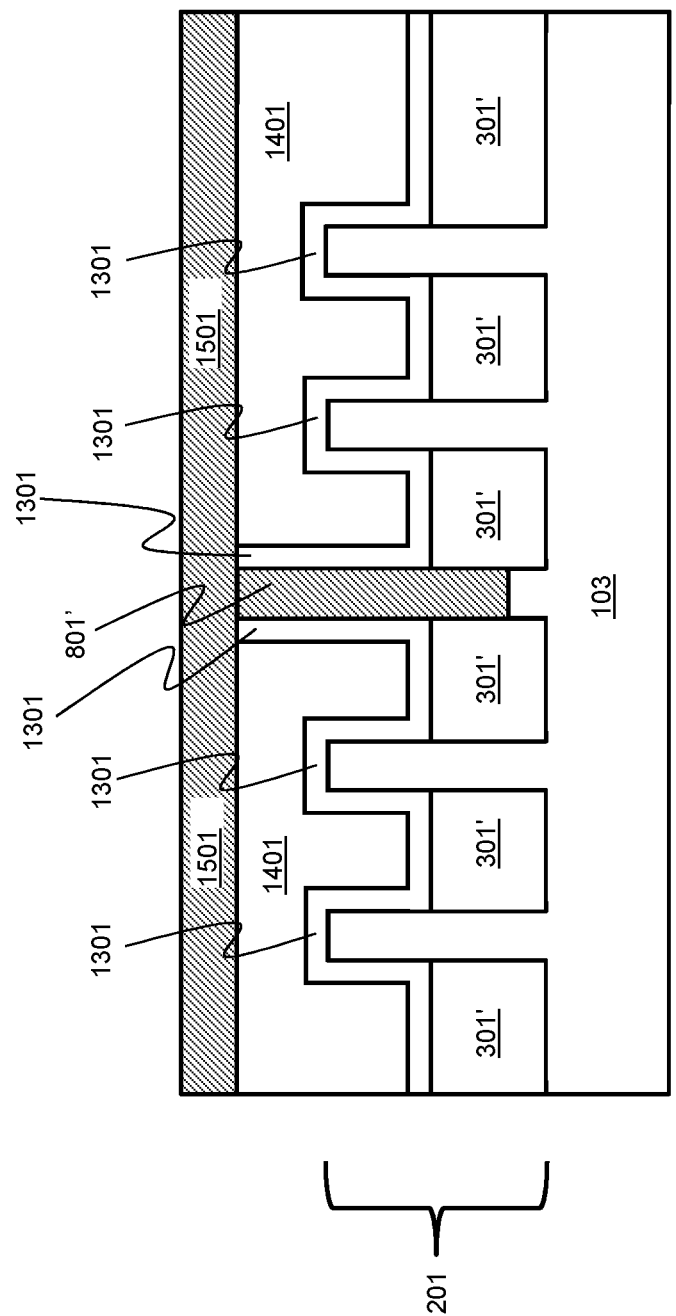

Next, the gate 1401 is planarized down to the CT pillar 801' and a cap layer 1501 is formed, e.g., of SiN to a thickness of 10 nm to 100 nm, over the gate 1401 and CT pillar 801', as depicted in FIG. 15. Consequently, the fins 201 and respective gates on the left and right sides of the CT 801' are totally isolated without any of the WF metal layer 1301 of the fins 201 merging with the WF metal layer 1301 of the CT pillar 801'.

Figure 16:
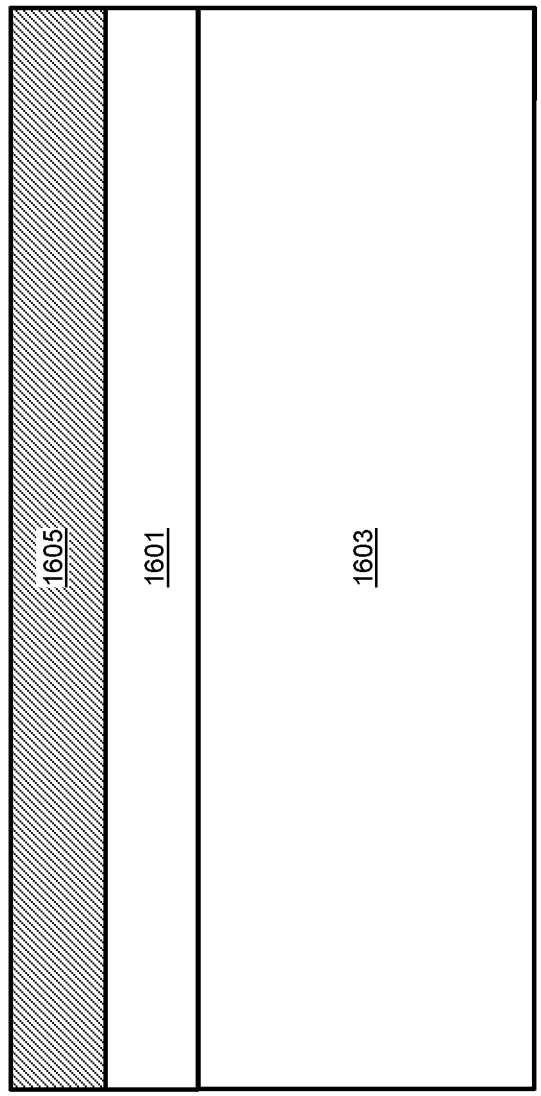
FIGS. 16 through 31 schematically illustrate cross-sectional views of a process flow for forming a self-aligned CT pillar having the same CD width as the device fins to provide PC isolation, in accordance with another exemplary embodiment.
Figure 17:
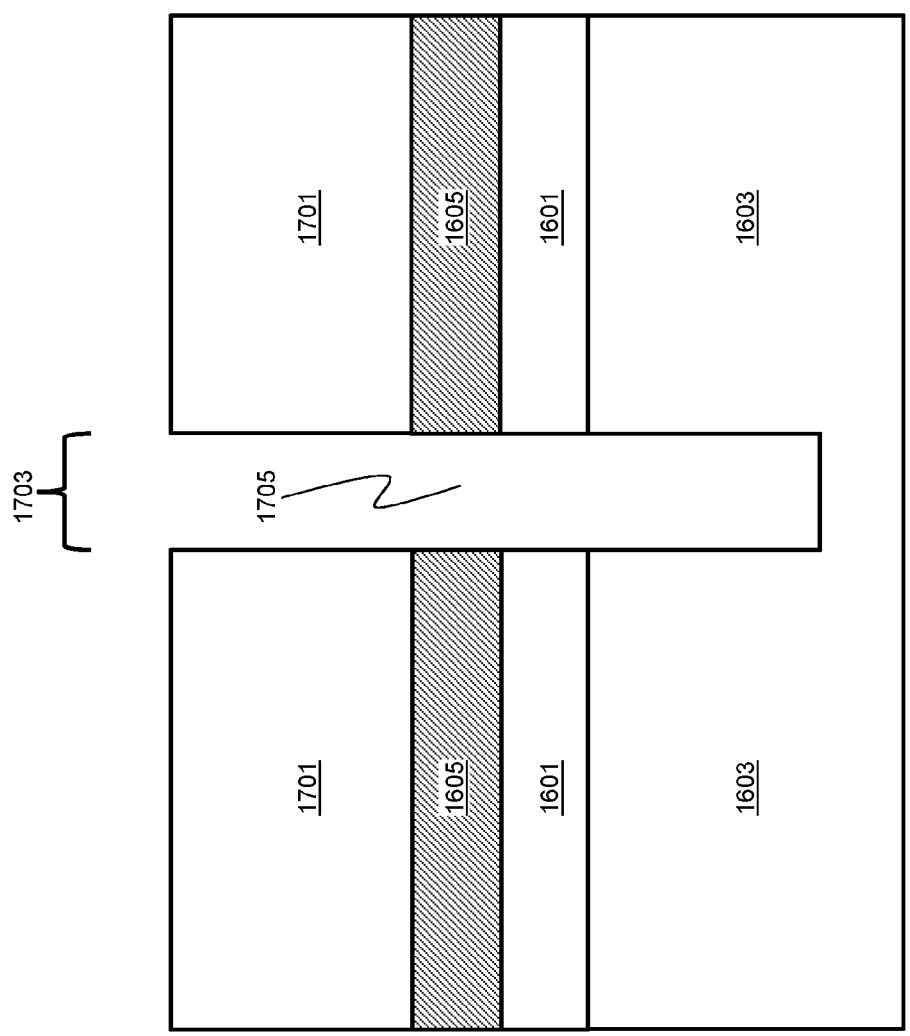

FIGS. 16 through 31 schematically illustrate cross-sectional views of a process flow for forming a self-aligned CT pillar having the same CD width as the device fins to provide PC isolation, in accordance with another exemplary embodiment. Referring to FIG. 16, an oxide layer 1601 is formed, e.g., to a thickness of 10 nm to 150 nm, over a substrate 1603, e.g., formed of Si. A SiN layer 1605 is then formed, e.g., to a thickness of 10 nm to 150 nm, over the oxide layer 1601. Referring to FIG. 17, a photoresist layer 1701 is formed over the SiN layer 1605 and an opening 1703, laterally centered over the substrate 1603, is formed, e.g., by photolithography, through the photoresist layer 1701 down to the SiN layer 1605. The SiN layer 1605, the oxide layer 1601, and the substrate 1603 are then etched, e.g., by RIE, to a depth of 50 nm to 200 nm below the upper surface of the substrate 1603, forming the trench 1705.

Figure 18:
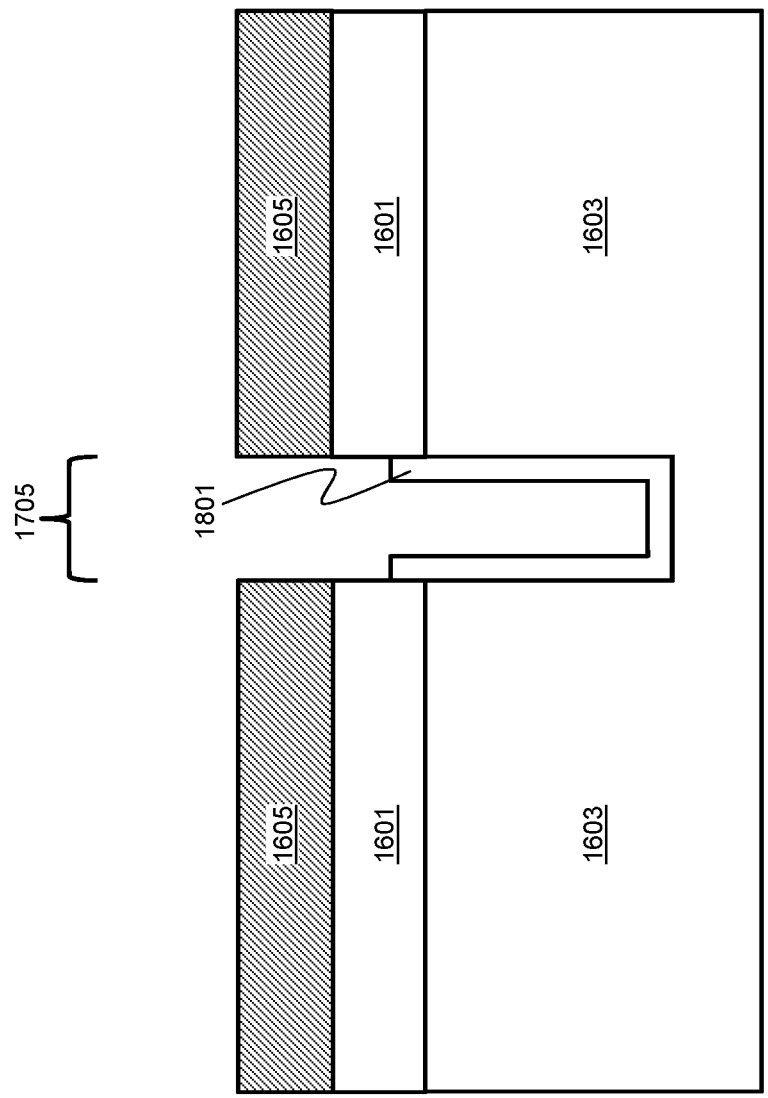
Figure 19:
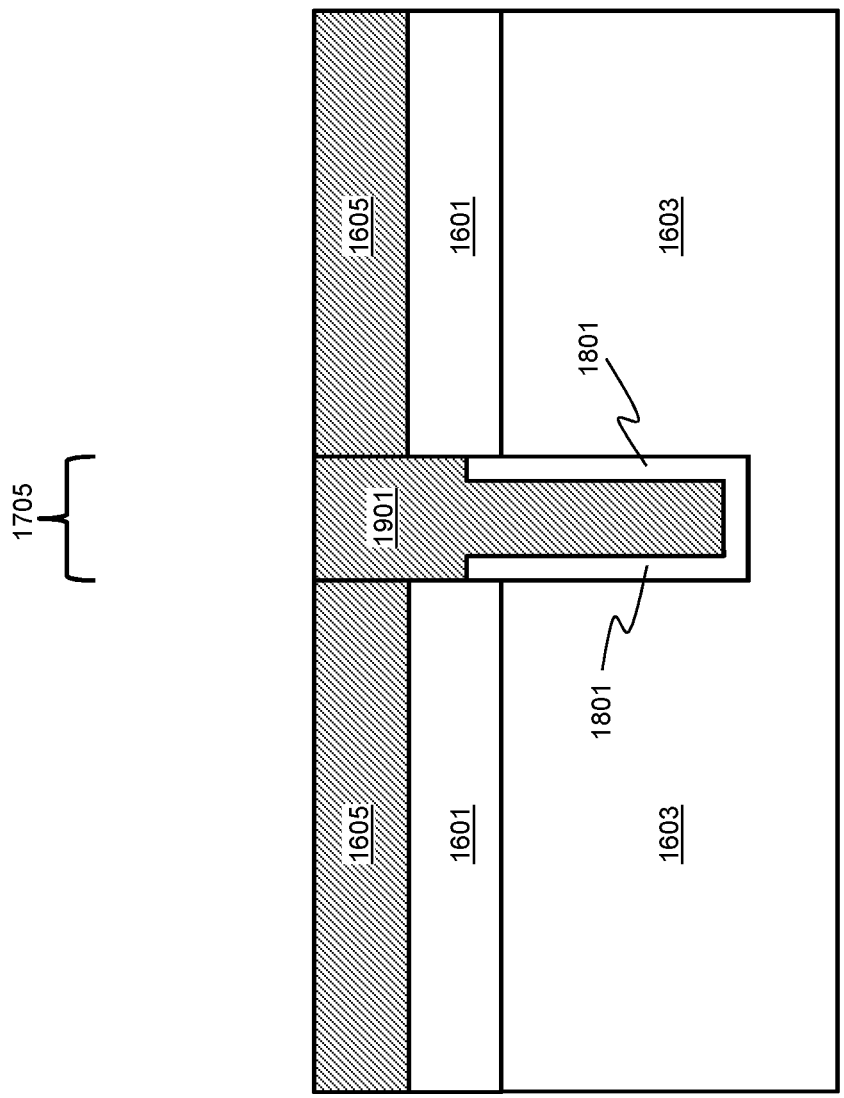

Next, the photoresist layer 1701 is stripped and an oxide layer 1801 is formed, e.g., to a thickness of 5 nm to 20 nm, in and along the sidewalls of the trench 1705 and then recessed, e.g., between an upper surface of the substrate 1603 and an upper surface of the oxide layer 1601, as depicted in FIG. 18. The trench 1705 is then filled with a SiN layer 1901 and planarized, e.g., by CMP, down to the SiN layer 1605, as depicted in FIG. 19.

Figure 20:
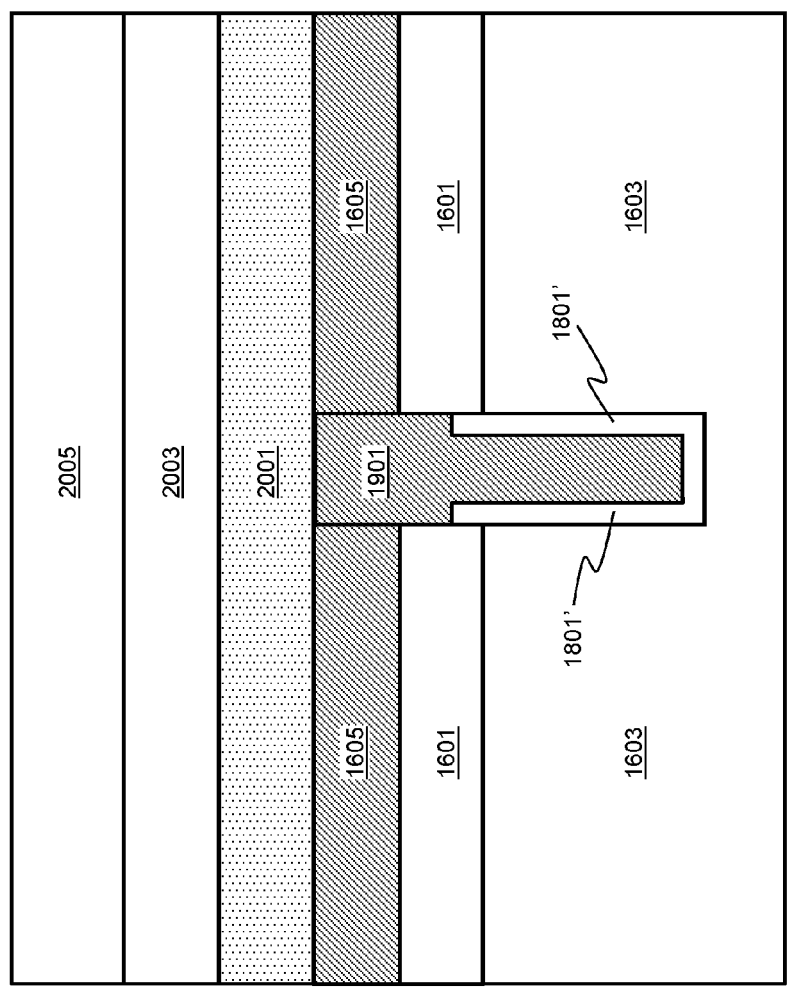
Figure 21:
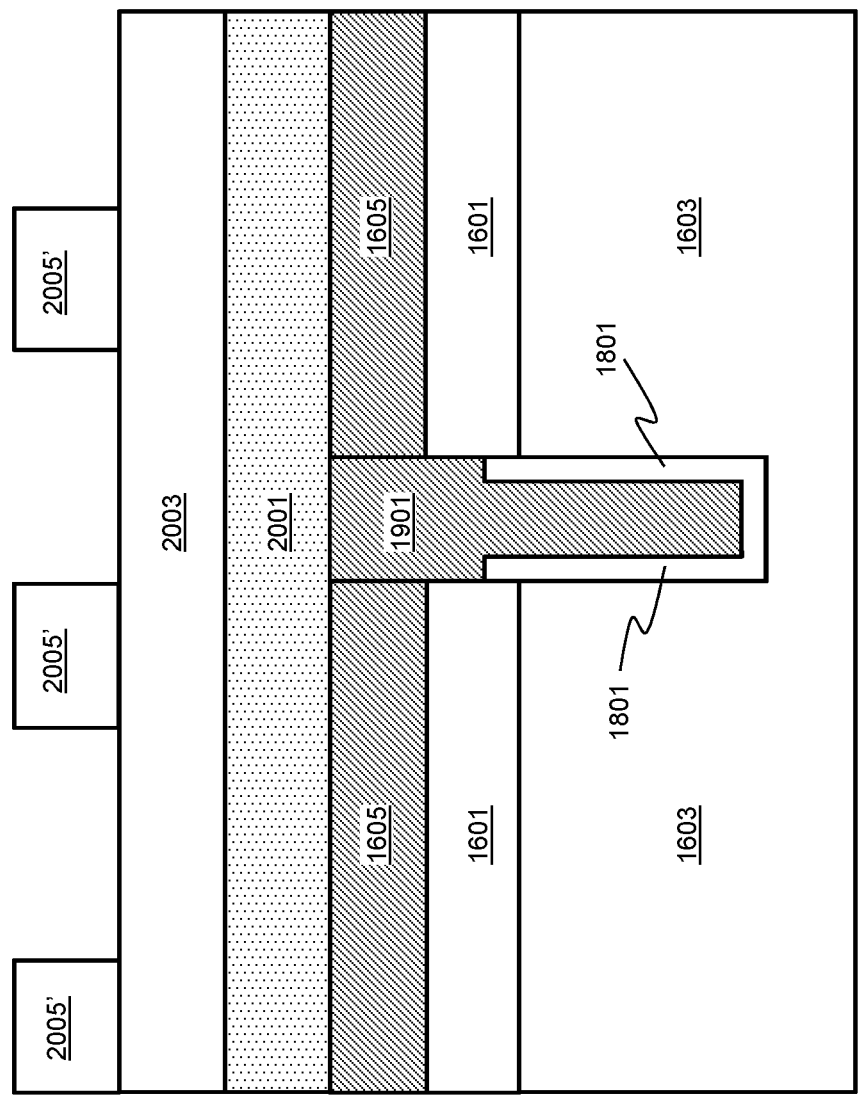
Figure 22:
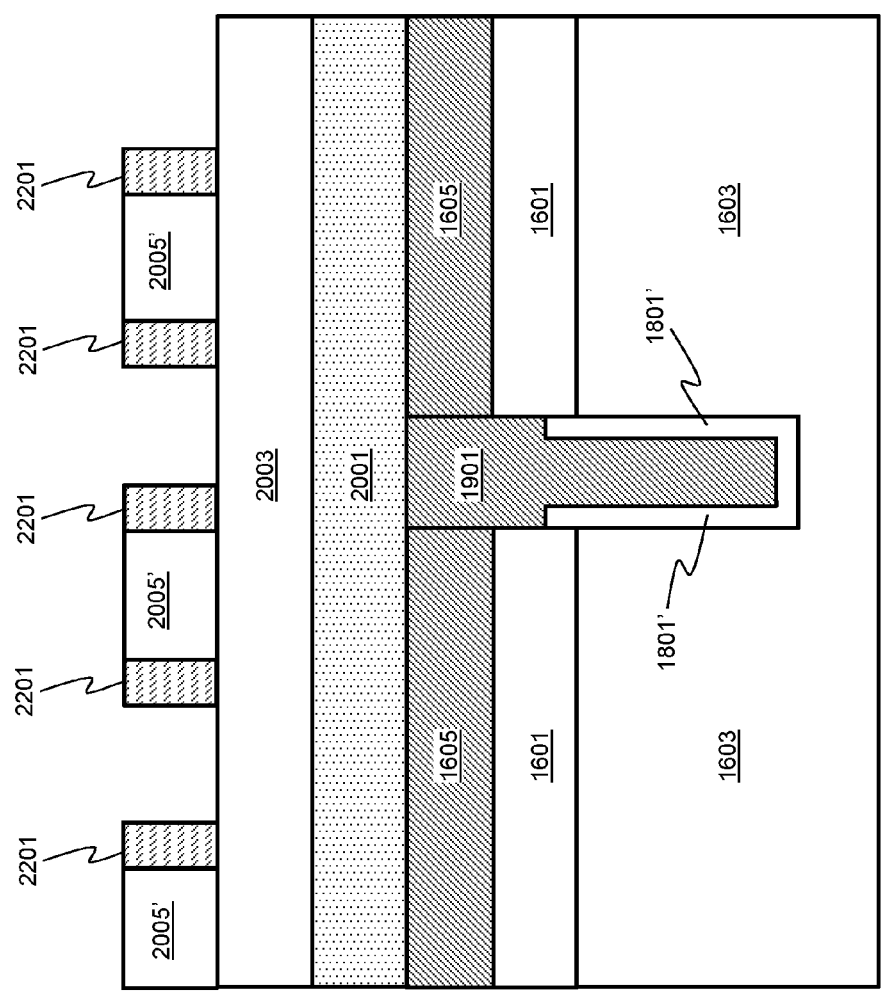
Figure 23:
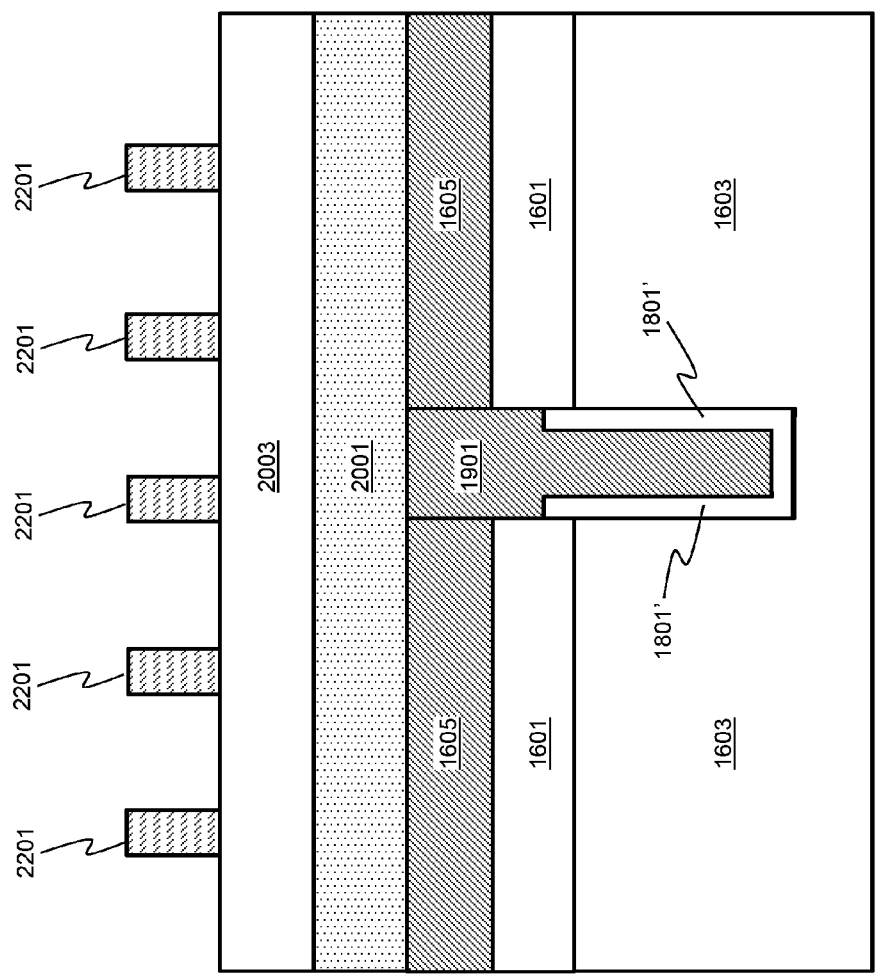
Figure 24:
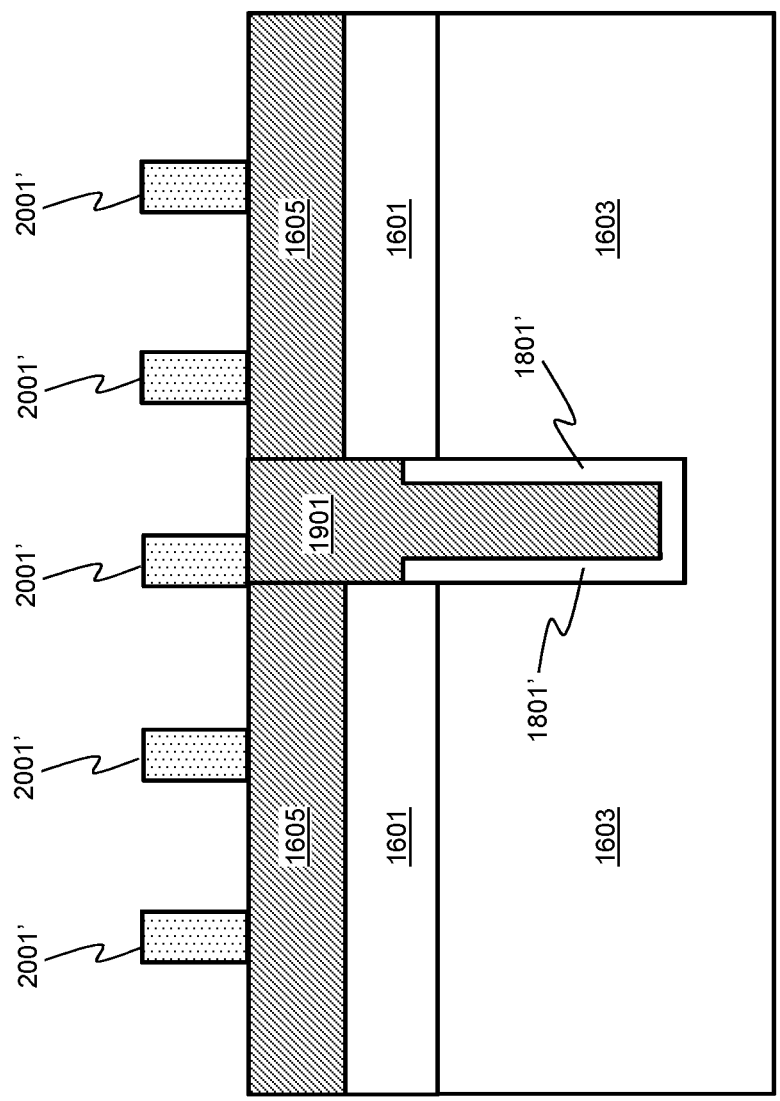
Figure 25:
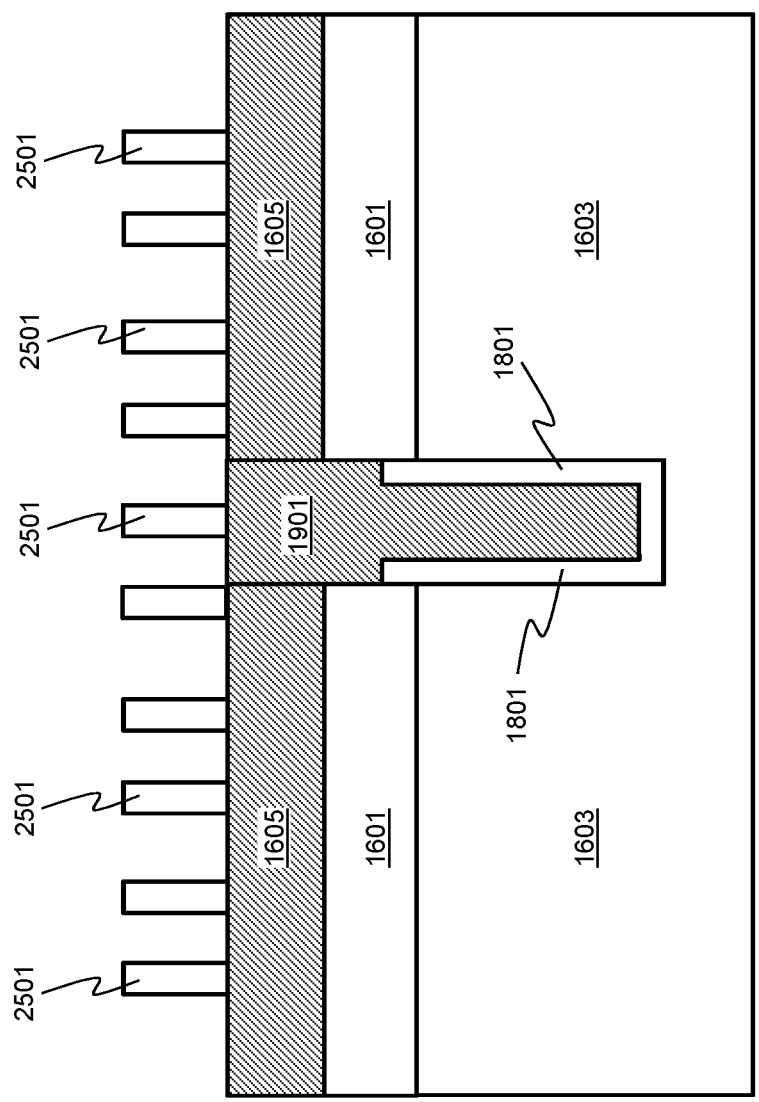
Figure 26:
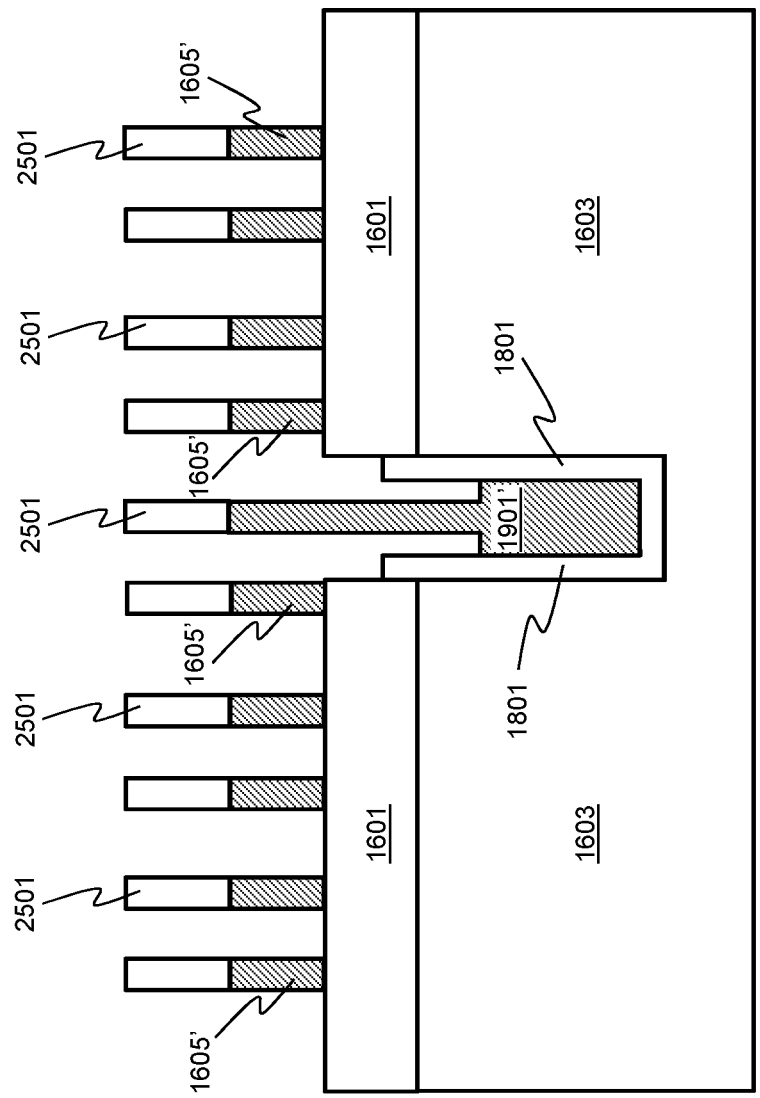

Referring to FIG. 20, a MTO layer 2001, a Si layer 2003, and an a-C layer 2005 are sequentially formed over the substrate 1603 as part of a known SAQP process to form the subsequently formed fins and CT pillar. For example, the a-C layer 2005 is first patterned, e.g., by photolithography, forming the a-C mandrels 2005', as depicted in FIG. 21. Next, an oxide mandrel 2201 is formed on opposite sides of each a-C mandrel 2005', as depicted in FIG. 22. The a-C mandrels 2005' are then removed, as depicted in FIG. 23. Referring to FIG. 24, MTO mandrels 2001' are formed by etching the Si and MTO layers 2003 and 2001, respectively, between and adjacent to the oxide mandrels 2201 and then removing the oxide mandrels 2201 and remaining Si layer 2003. Referring to FIG. 25, an oxide or a-Si mandrel 2501 is formed adjacent to and on opposite sides of each MTO mandrel 2001' and then the MTO mandrels 2001' are removed. Notably, as a result of the SAQP process, an oxide or a-Si mandrel 2501 is formed over the center of the SiN layer 1901. The SiN layer 1605 and 1901 are then etched, e.g., by RIE, between and adjacent to the oxide or a-Si mandrels 2501 down to the oxide layer 1601 and the SiN layer 1901 is further etched, e.g., 30 nm to 300 nm, forming the SiN mandrels 1605' and 1901', as depicted in FIG. 26.

Figure 27:
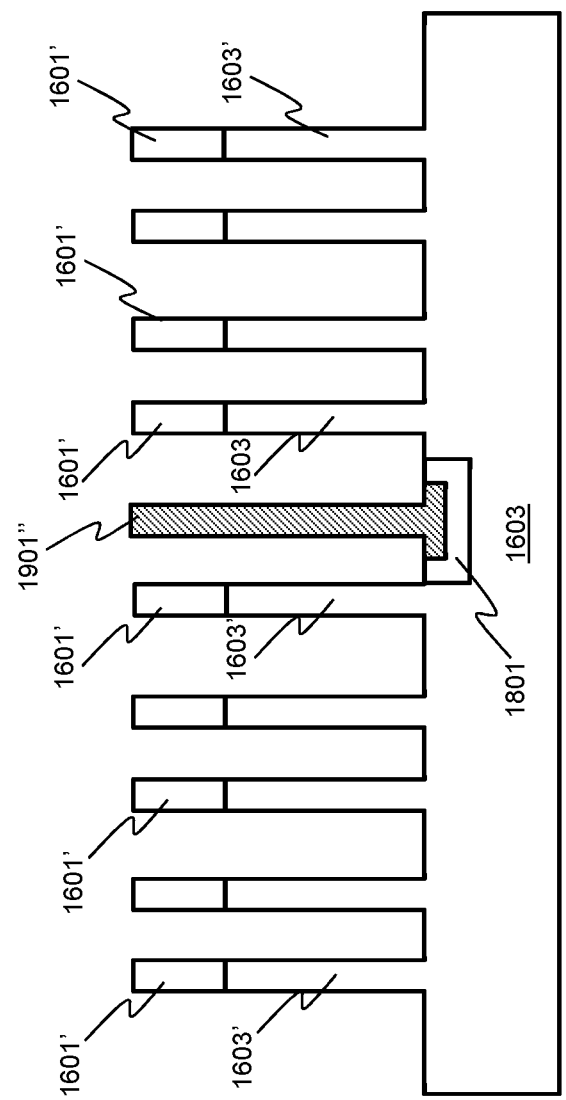
Figure 28:
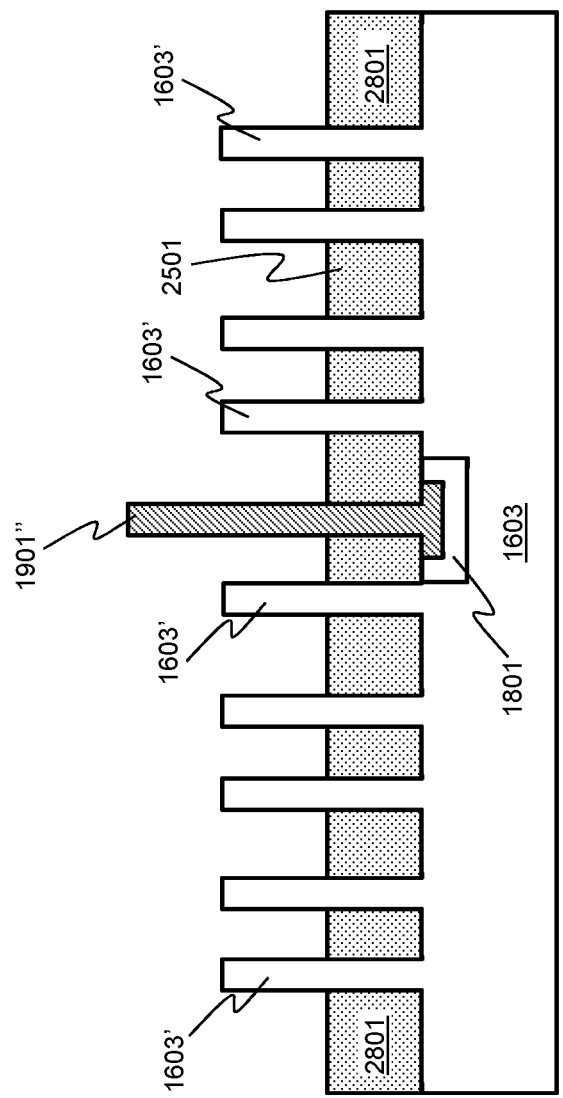

Referring to FIG. 27, oxide caps 1601', fins 1603', and the CT pillar 1901" are formed by etching, e.g., RIE, the oxide layers 1601 and 1801, the substrate 1603, and a portion of the SiN mandrel 1901' to a depth, e.g., of 50 nm to 150 nm, between and adjacent to the SiN mandrels 1605' and 1901'. The SiN mandrels 1605' and 1901' are then removed. Next, the oxide caps 1601' are removed and a flowable oxide layer 2801 is formed, e.g., to a thickness of 100 nm, over the substrate 1603 and between a portion of the fins 1603' and CT pillar 1901", as depicted in FIG. 28

Figure 29:
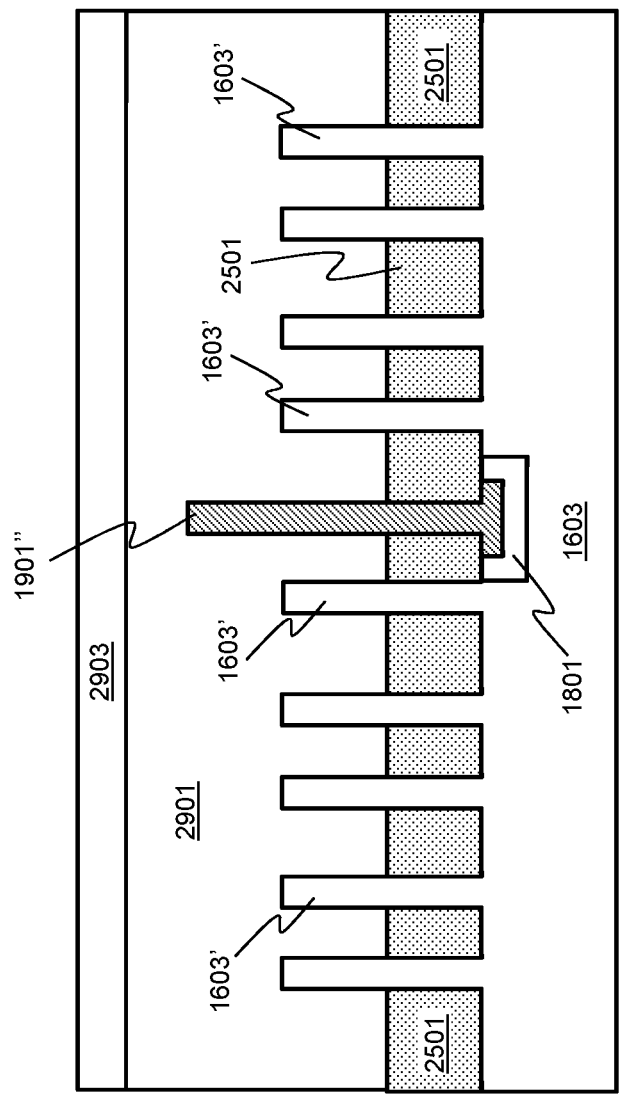
Figure 30:
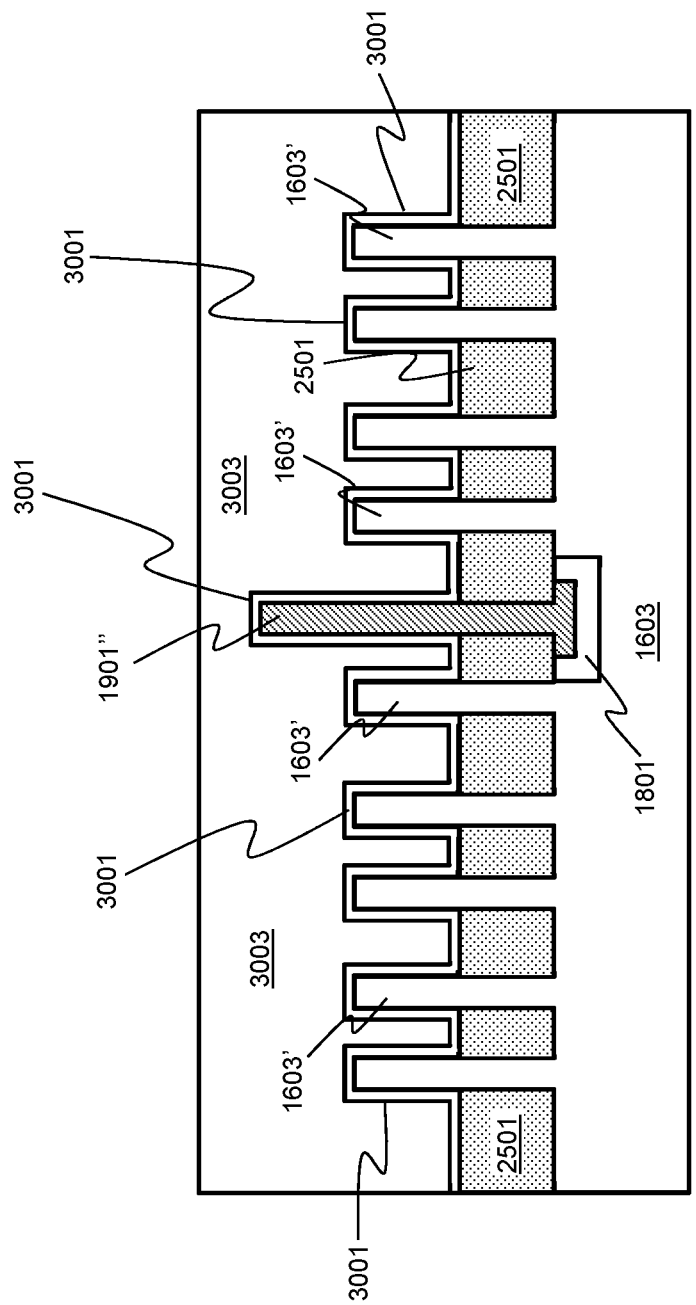
Figure 31:
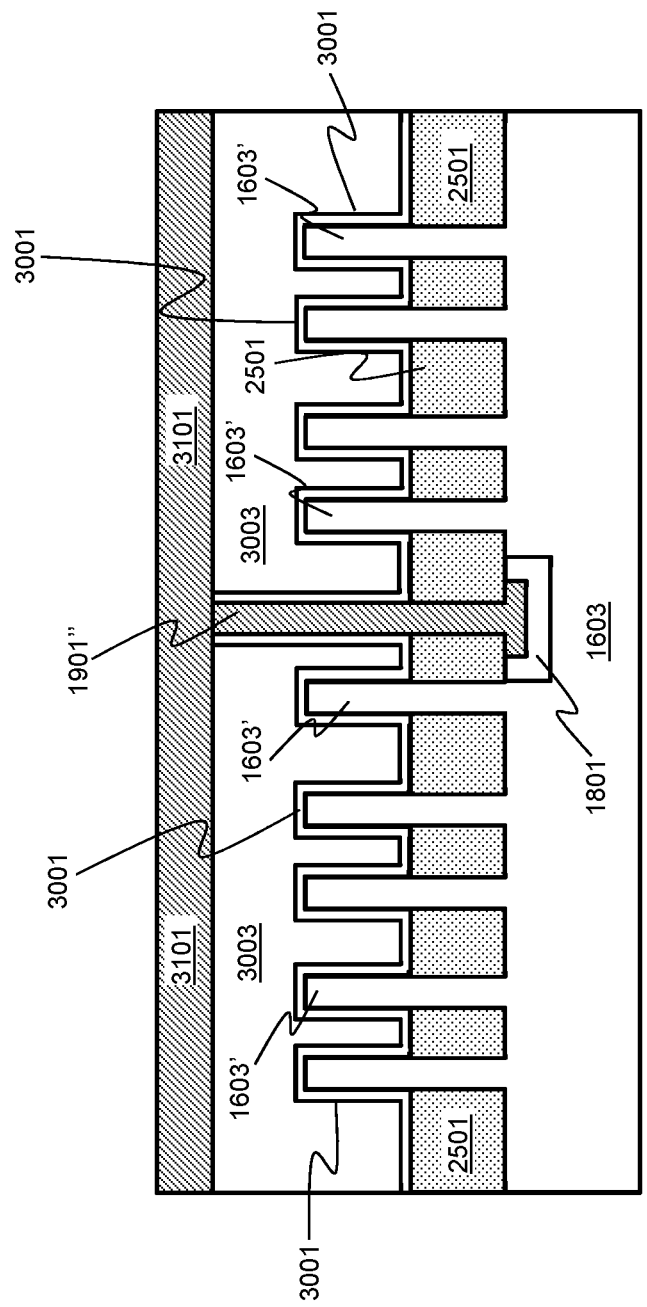

The process steps of FIGS. 12 through 15 are then repeated with respect to FIGS. 29 through 31. Referring to FIG. 29, a dummy oxide layer (not shown for illustrative convenience) is formed over and along sidewalls of the fins 1603', a dummy gate 2901 is formed, e.g., of Si, over the substrate 1603, and a cap layer 2903 is formed, e.g., of SiN, over the dummy gate 2901. Again, in this instance, there is a distance between the top of the CT pillar 1901" and an upper surface of the dummy gate 2901; however, it is contemplated that that the CT pillar 1901" could penetrate through the top of the dummy gate 2901. The dummy gate 2901 and cap layer 2903 are then removed and a HK layer (not shown for illustrative convenience) is formed, e.g., to a thickness of 1 nm to 5 nm, over the substrate and along the sidewalls of the CT pillar 1901". Referring to FIG. 30, a WF metal layer 3001 is formed, e.g., to a thickness of 3 nm to 15 nm, over the HK layer and a gate 3003 is formed, e.g., of W, over the WF metal layer 3001 and planarized, e.g., by CMP. Again, at this stage of the process, the gate 3003 may be planarized down to, but not past, the WF layer 3001.

Referring to FIG. 31, the gate 3003 is then planarized, e.g., by CMP, down to the CT pillar 1901" and a cap layer 3101 is formed, e.g., of SiN to a thickness of 10 nm to 100 nm, over the gate 3003 and CT pillar 1901". Consequently, the fins 1603' and respective gates on the left and right sides of the CT pillar 1901" are totally isolated without any of the WF metal layer 3001 of the fins 1603' merging with the WF metal layer 3001 of the CT pillar 1901".

The embodiments of the present disclosure can achieve several technical effects including providing PC isolation with a self-aligned CT pillar having the same CD width as the device fins thereby also providing technology scalability. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of FinFET semiconductor devices in the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a plurality of fins over a substrate;
   forming an oxide layer over the substrate and between each fin;
   removing a portion of a central fin among the plurality, a trench formed in the oxide layer;
   forming a gate cut (CT) pillar in the trench;
   recessing the oxide layer below an upper surface of the plurality of fins;
   forming a gate over the plurality of fins and CT pillar;
   planarizing the gate down to the CT pillar; and
   forming a cap layer over the gate and CT pillar.

2. The method according to claim 1, comprising forming the plurality of fins by:
   forming a silicon nitride (SiN) layer over the substrate;
   patterning the SiN layer, a plurality of SiN caps formed; and
   removing portions of the substrate through the plurality of SiN caps, a SiN cap remaining over each fin of the plurality.

3. The method according to claim 2, comprising forming the oxide layer by:
   forming the oxide layer over the substrate and between the plurality of fins and each SiN cap; and
   planarizing the oxide layer down to the SiN caps.

4. The method according to claim 2, further comprising forming a dummy cap over each fin of the plurality by:
   removing each SiN cap, a trench formed in the oxide layer over each fin;
   forming a dummy layer over the substrate and in each trench; and
   planarizing the dummy layer down to the oxide layer.

5. The method according to claim 4, comprising removing the portion of the central fin by:
   forming a photoresist layer over the substrate;
   forming an opening in the photoresist layer over the central fin down to the oxide layer;
   removing a dummy cap and the portion of the central fin through the opening; and
   stripping the photoresist layer.

6. The method according to claim 1, comprising forming the CT pillar by:
   forming a SiN layer over the substrate and in the trench; and
   planarizing the SiN layer down to the oxide layer.

7. The method according to claim 1, comprising forming the gate by:
   forming a dummy oxide layer over and along sidewalls of the plurality of fins;
   forming a high-k (HK) layer over the substrate and along sidewalls of the CT pillar;
   forming a work function (WF) metal layer over the HK layer; and
   forming the gate over the WF metal layer.

8. The method according to claim 7, comprising:
   forming a dummy gate over the substrate subsequent to the forming of the dummy oxide layer and prior to the forming of the HK layer;
   forming a cap layer over the dummy gate; and
   removing the dummy gate and cap and layer prior to forming the HK layer.

9. A device comprising:
   a plurality of fins over a substrate;
   an oxide layer over the substrate and between a portion of each fin;
   a gate cut (CT) pillar over a central fin among the plurality, a lower surface of the CT pillar being below an upper surface of the oxide layer;
   a gate over the plurality of fins and CT pillar; and
   a cap layer over the gate and CT pillar.

10. The device according to claim 9, further comprising:
    a dummy oxide layer over and along sidewalls of the plurality of fins;
    a high-k (HK) layer over the substrate and along sidewalls of the CT pillar;
    a work function (WF) metal layer over and along the HK layer; and
    the gate over the WF metal layer.

11. A method comprising:
    forming a first oxide layer over a substrate;
    forming a first silicon nitride (SiN) layer over the oxide layer;
    forming a trench through the first SiN and oxide layers and a portion of the Si substrate;
    forming a second oxide layer in and along sidewalls of the trench;
    recessing the second oxide layer between an upper surface of the substrate and an upper surface of the first oxide layer;
    filling the trench with a second SiN layer;
    forming a plurality of first and second SiN layer mandrels laterally separated over the substrate;
    removing equal portions of the second SiN layer in the trench on opposite sides of a second SiN layer mandrel;
    forming a plurality of fins and a gate cut (CT) pillar laterally centered therebetween over the substrate;
    forming an third oxide layer over the substrate and between a portion of the plurality of fins and CT pillar;
    forming a gate over the plurality of fins and CT pillar;
    planarizing the gate down to the CT pillar; and
    forming a cap layer over the gate and CT pillar.

12. The method according to claim 11, comprising forming the trench by:
    forming a photoresist layer over the substrate;
    forming an opening laterally centered over the substrate through the photoresist layer down to the first SiN layer;
    etching the first SiN and oxide layers and the substrate through the opening to a depth of 50 nanometer (nm) to 200 nm below an upper surface of the substrate; and
    stripping the photoresist layer.

13. The method according to claim 11, comprising forming the plurality of first and second SiN layer mandrels by:
    forming a medium temperature oxide (MTO) layer over the first and second SiN layers;
    forming a silicon (Si) layer over the MTO layer;
    forming an amorphous carbon (a-C) layer over the Si layer; and performing a self-aligned quadruple patterning (SAQP) process through the a-C, Si, MTO, and first and second SiN layers down to the oxide layer.

14. The method according to claim 11, comprising removing the equal portions by:
reactive-ion etching (RIE).

15. The method according to claim 11, comprising forming the plurality of fins and the CT pillar by:
etching the first and second oxide layers, substrate, and a portion of the second SiN layer in the trench to a depth of 50 nanometer (nm) to 150 nm, a first oxide layer cap formed ever each fin; and
removing the first and second SiN layer mandrels.

16. The method according to claim 15, comprising removing the first oxide layer caps prior to the forming of the third oxide layer.

17. The method according to claim 11, comprising forming the gate by:
forming a dummy oxide layer over and along sidewalls of the plurality of fins;
forming a high-k (HK) layer over the substrate and along sidewalls of the CT pillar;
forming a work function (WF) metal layer over the HK layer; and
forming the gate over the WF metal layer.

18. The method according to claim 17, comprising:
forming a dummy gate over the substrate subsequent to the forming of the dummy oxide layer and prior to the forming of the HK layer;
forming a cap layer over the dummy gate; and
removing the dummy gate and cap layer prior to forming the HK layer.

19. A device comprising:
a plurality of fins over a substrate, the substrate having a laterally centered trench;
a first oxide layer in and along sidewalls of the trench;
a gate cut (CT) pillar laterally centered over the trench and having a base over and along sidewalls of the first oxide layer;
a second oxide layer over the substrate and between the fins and CT pillar, an upper surface of the second oxide layer below an upper surface of the fins;
a gate over the plurality of fins and CT pillar; and
a cap layer over the gate and CT pillar.

20. The device according to claim 19, further comprising:
a dummy oxide layer over and along sidewalls of the plurality of fins;
a high-k (HK) layer over the substrate and along sidewalls of the CT pillar;
a work function (WF) metal layer over and along the HK layer; and
the gate over the WF metal layer.

* * * * *